United States Patent
Atsumo et al.

(10) Patent No.: US 7,719,386 B2
(45) Date of Patent: May 18, 2010

(54) PHASE SHIFTER HAVING COMPONENTS WHICH SUPPRESS FLUCTUATIONS IN THE PHASE SHIFTER PASS CHARACTERISTICS

(75) Inventors: Takao Atsumo, Kanagawa (JP); Hiroshi Mizutani, Kanagawa (JP); Tatsuya Miya, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/923,092

(22) Filed: Oct. 24, 2007

(65) Prior Publication Data
US 2008/0100399 A1 May 1, 2008

(30) Foreign Application Priority Data
Nov. 1, 2006 (JP) .............................. 2006-297296

(51) Int. Cl.
*H03H 7/20* (2006.01)
(52) U.S. Cl. ..................... 333/139; 333/164; 333/262; 333/103
(58) Field of Classification Search .................. 333/139, 333/164, 103, 104, 262
See application file for complete search history.

(56) References Cited

U.S. PATENT DOCUMENTS

2005/0093026 A1* 5/2005 Sagae et al. .................. 257/213
2006/0001507 A1* 1/2006 Nakamura .................. 333/164

FOREIGN PATENT DOCUMENTS

JP 2006-19823 A 1/2006

* cited by examiner

*Primary Examiner*—Benny Lee
(74) *Attorney, Agent, or Firm*—Sughrue Mion, PLLC

(57) ABSTRACT

A phase shifter selectively switches between a low-pass filter 13 and a high-pass filter 12 using single pole double throw switches 10a and 10b provided on the input and output sides, respectively, and operatively linked to each other. The single pole double throw switches 10a and 10b include FETs Q1c and Q1d that connect single pole side junctions and the low-pass filter, respectively, and inductance circuits (L1c and R2c, and L1d and R2d) connected in parallel with FETs Q1c and Q1d, respectively. The inductance circuits are respectively comprised of the inductor L1c and the resistor R2c connected in series and of the inductor L1d and the resistor R2d connected in series.

13 Claims, 12 Drawing Sheets

US 7,719,386 B2

PHASE SHIFTER HAVING COMPONENTS WHICH SUPPRESS FLUCTUATIONS IN THE PHASE SHIFTER PASS CHARACTERISTICS

REFERENCE TO RELATED APPLICATION

This application is based upon and claims the benefit of the priority of Japanese patent application No. 2006-297296, filed on Nov. 1, 2006, the disclosure of which is incorporated herein in its entirety by reference thereto.

FIELD OF THE INVENTION

The present invention relates to a phase shifter, and particularly to a filter switching-over type phase shifter for use in microwave band.

BACKGROUND OF THE INVENTION

The filter switching-over type phase shifter is usually made up by a high-pass filter (HPF) for producing the phase lead of the signal phase, a low-pass filter for producing the phase lag of the signal phase (LPF), and single pole double throw switches (SPDT switches) for switching-over between the high-pass and low-pass filter units. The amount of phase shift is created by the phase difference produced on switching-over between these two types of the filter units.

The configuration of this filter switching-over type phase shifter will now be described. FIG. 9 is a circuit diagram showing a basic configuration of a filter switching-over type phase shifter of a type described in Patent Document 1. A high-pass filter (HPF) 112 is made up by two capacitors C111 and C112, connected in series with a signal line, and an inductor L111, connected from a junction of the two capacitors C111 and C112 to the ground. A low-pass filter (LPF) 113 is made up by two inductors L112 and L113, connected in series with a signal line, and a capacitor C113, connected from the junction of the two inductors L112 and L113 to the ground. The high-pass filter 112 and the low-pass filter 113 are connected via a single pole double throw switch (SPDTSW) 110 to an input terminal IN, while being connected via a single pole double throw switch (SPDTSW) 110 to an output terminal OUT.

The operation of the phase shifter, constructed as described above, will now be explained. If, when a signal from the input terminal IN to the output terminal OUT is passed through the high-pass filter 112, a bias, not shown, operating for turning an FET (field-effect transistor) Q101 on, is applied to the gates of FETs (field-effect transistors) Q101 and Q103, the source-drain resistance is lowered to establish a practically short-circuited state, and hence the signal is allowed to pass through the high-pass filter 112.

Meanwhile, a bias voltage, not shown, which turns off the FET, is applied to the gates of FETs Q105 and Q107, in order to inhibit the signal flowing to the low-pass filter 113, thereby increasing the source-drain resistance of the FETs Q105 and Q107.

On the other hand, when the low-pass filter 113 is turned on, the signal is allowed to flow to the low-pass filter 113 by applying the bias which is the reverse of that described above to the gates of the FETs of the single pole double throw switches 110 and 111.

In this manner, the single pole double throw switches 110 and 111 are changed (switched) over so that signals will flow through the high-pass filter 112 or the low-pass filter 113. The input signal will be delayed by the inductors L112 and L113, connected in series with the low-pass filter 113, when the signal is passed through the low-pass filter 113, while the input signal will lead (advance) by the capacitors Cl11 and C112, connected in series with the high-pass filter 112. Hence, the phase difference of the signal is produced by changing over the filter units by the single pole double throw switches 110 and 111. It is noted that, for realizing a desired phase shift value, the values of the components in the respective filter units need to be changed to optimum values.

[Patent Document 1]
Japanese Patent Kokai Publication No. JP-P2006-19823A (FIG. 3)

SUMMARY OF THE INVENTION

The following analyses are given by the present invention. The entire disclosure of Patent Documents 1 is incorporated herein by reference thereto.

Meanwhile, with the high frequency band, such as the GHz band, the signal leaks via the FETs that are turned off, depending on the off-capacitance of the FETs of the single pole double throw switches. As a solution, inductors are connected in parallel with the FETs. In other words, inductors L121, L123, L122, and L124 are connected in parallel with the FETs Q101, Q103, Q105, and Q107, respectively. By connecting the inductors in parallel with the FETs, a parallel resonance circuit in a desired band is formed by the off-capacitance of the FETs that are turned off and the inductance of the inductors. This parallel resonance circuit puts an off-state switch in a high-impedance state, thereby improving the cut-off characteristics. As a result, the pass characteristics of the on-state switch will also improve.

However, according to the present invention, it has been discovered that, depending upon the conditions, the square error of the phase shift amount versus frequency deteriorates in the conventional phase shifter. In other words, the desirable pass characteristics of the high-pass filter cannot always be obtained. Therefore, the following analysis regarding the impedance characteristics of the switch that is turned off on the low-pass filter side has been performed.

The FETs can be approximated by resistance when they are turned on, and by capacitance when they are off. FIG. 10 shows an equivalent circuit of the phase shifter in which the FETs on the high-pass filter side are turned on and the FETs on the low-pass filter side are turned off. FIG. 10 includes input terminal IN and output terminal OUT and single pole double throw switches 110 and 111. FIG. 10 also includes a high-pass filter (HPF) 112 having two capacitors (capacitance C2, each) connected in series and an inductor (inductance L2) connected to the junction (node) of the two capacitors is provided between a pair of on-state switches, each being comprised of a resistance R1 equivalently representing the on-state FET, and inductor (inductance L1) connected in parallel with the resistance R1. Further, a low-pass filter (LPF) 113 having two inductors (inductance L3, each) connected in series and a capacitor (capacitance C3) connected to the junction (node) of the two inductors is provided between a pair of off-state switches, each being comprised of capacitors (capacitance Cl) equivalently representing the off-state FET, and inductors (the inductance L1) connected in parallel with the capacitors.

Next, an impedance Z, looking from the input or output side to the low-pass filter side, is calculated. Since the phase shifter is configured symmetrically about the filters, $C_3$ may be regarded as an equivalent of two capacitors with $C_3/2$ capacitance shunt-connected in parallel. Further, since it is enough that only one side of the symmetry axis may be taken into consideration, and the other side may be ignored, the impedance calculation can be simplified. The impedance Z in the equivalent circuit in FIG. 10 can be represented by an equivalent circuit shown in FIG. 11. FIG. 11 includes capacitors $C_1$ and $C_3/2$ and inductors $L_1$ and $L_3$.

Here, the impedance Z with respect to frequency $\omega$ is represented as follows.

$$Z = j\left(\frac{\omega L_1}{1-\omega^2 L_1 C_1} + \omega L_3 - \frac{2}{\omega C_3}\right)$$

Therefore, $$|Z| = \frac{\omega L_1}{1-\omega^2 L_1 C_1} + \omega L_3 - \frac{2}{\omega C_3}$$

Further, the resonance frequency $\omega_0$ in the parallel resonance circuit in which L1 and C1 are connected in parallel is represented by $$\omega_0 = \sqrt{\frac{1}{L_1 C_1}}$$

and $$C_1 = \frac{1}{\omega_0^2 L_1}$$

Next, C1 is substituted into the equation |Z|, and |Z| is derived by numerical calculation. The frequency response of |Z| is shown in FIG. 12. Here, $f_0=10$ GHz ($=\omega_0/2\pi$), $L_1=1$ nH; $L_3=0.03$ nH; $C_3=0.2$ pF. As shown in FIG. 12, |Z| becomes 0 ohms (short-circuited) at a frequency of 8.46 GHz.

The off-state side, i.e., the low-pass filter side, should have a high impedance, however, depending on the frequency, a short circuit occurs as described. As a result, the pass characteristics (curve) of the high-pass filter side will deteriorate, and the phase shift curve will fluctuates by small peaks (positive and/or negative, i.e., recess) caused by unnecessary resonances, causing the square error of the phase shift amount versus frequency to deteriorate.

In order to solve the problem of the deterioration of the pass characteristics caused by the short-circuit in the resonance circuit described above, the present inventor has conceived that the decrease in impedance can be prevented by adding resistance to the inductor in series thereby decreasing the Q factor of the resonance circuit at resonance. In other words, the present inventor has come to a concept that desirable pass characteristics can be obtained by providing (adding) appropriate resistance value to the inductor, and achieved the present invention.

According to an aspect of the present invention, there is provided a phase shifter that selectively switches between a low-pass filter and a high-pass filter using first and second single pole double throw switches provided on input and output sides respectively and operatively linked to each other; wherein the first and second single pole double throw switches include a first switch device that connects a single pole side junction node and the low-pass filter, a first inductance circuit connected in parallel with the first switch device, a second switch device that connects the single pole side junction node and the high-pass filter and that performs an ON/OFF operation exclusively from the first switch device, and a second inductance circuit connected in parallel with the second switch device; provided that the first inductance circuit is constituted by a serially-connected circuit of an inductor and a resistor.

The inductance of the inductor, the resistance of the resistor and the capacitance of the first switch device in the off state in the first inductance circuit are selected so as to suppress/avoid fluctuation, deterioration in the pass characteristics of the phase shifter.

The meritorious effects of the present invention are summarized as follows.

According to the present invention, by adding resistance to an inductor in a switch device and an inductance circuit connected to a low-pass filter, occurrence of a short-circuit can be prevented in a resonance circuit formed by the inductance circuit and the capacitance of the switch device in an off state. As a result, the deterioration of the phase characteristics and amplitude characteristics in the pass characteristics can be prevented.

BRIEF DESCRIPTIONS OF THE DRAWINGS

FIG. 4 is a graph showing the frequency response of S21 in magnitude when the high-pass filter side is turned on.

FIG. 5 is a graph showing the frequency response of S21 in phase angle when the high-pass filter side is turned on.

FIG. 6 is a graph showing the frequency response of S21 in magnitude when the low-pass filter side is turned on.

FIG. 7 is a graph showing the frequency response of S21 in phase angle when the low-pass filter side is turned on.

FIG. 8 is a graph showing the frequency response of the phase difference obtained by subtracting the phase when the low-pass filter side is turned on from the phase when the high-pass filter side is turned on.

PREFERRED MODES OF THE INVENTION

A phase shifter relating to an example of the present invention selectively switches between a low-pass filter (LPF 13 in FIG. 1) and a high-pass filter (HPF 12 in FIG. 1) using first and second single pole double throw switches (10a and 10b in FIG. 1) provided on the input and output sides respectively and operatively linked to each other. The first and second single pole double throw switches include first switch device (Q1c and Q1d in FIG. 1) that connects the single pole side junction nodes and the low-pass filter, first inductance circuits (L1c and R2c, and L1d and R2d in FIG. 1) each connected in parallel with the first switch device, second switch devices (Q1a and Q1b in FIG. 1) that connect the single pole side junction nodes and the high-pass filter and that perform an ON/OFF operation exclusively from the first switch devices, and second inductance circuits (L1a and R2a, and L1b and R2b in FIG. 1) each connected in parallel with the second switch device. Each first inductance circuit is comprised of an inductor and resistor connected in series.

In the first inductance circuit, when the inductance of the inductor is L, the resistance of the resistor is R, and the capacitance of the first switch device in an off state is C, it is preferable that R be larger than 0 and smaller than $(L/C)^{1/2}$.

The resistance may be the parasitic resistance of the inductor. Further, the inductor and the resistor may be made up of a material having an electrical resistivity higher than that of gold. Further, the inductor may be made up of a material having an electrical resistivity equal to or lower than that of gold. It is preferable that the switch devices be constituted by field-effect transistors.

In the phase shifter configured as described, the switch device and the inductance circuit are connected in parallel, and when the switch device is turned off, a resonance circuit is formed by the inductance circuit and the capacitance of the turned off switch device. In this case, in the inductance circuit connected in parallel with the switch device connected to the low-pass filter, formation of a short-circuit can be prevented in the resonance circuit by adding the resistor to the inductor in series. As a result, the cut-off performance of the switch device when it is turned off will improve. Therefore, the influence of the impedance on the off-state low-pass filter side on the pass characteristics of the on-state high-pass filter can be reduced, and the insertion loss versus frequency and the fluctuations in the phase shift amount can be minimized.

EXAMPLE 1

Figure 1:
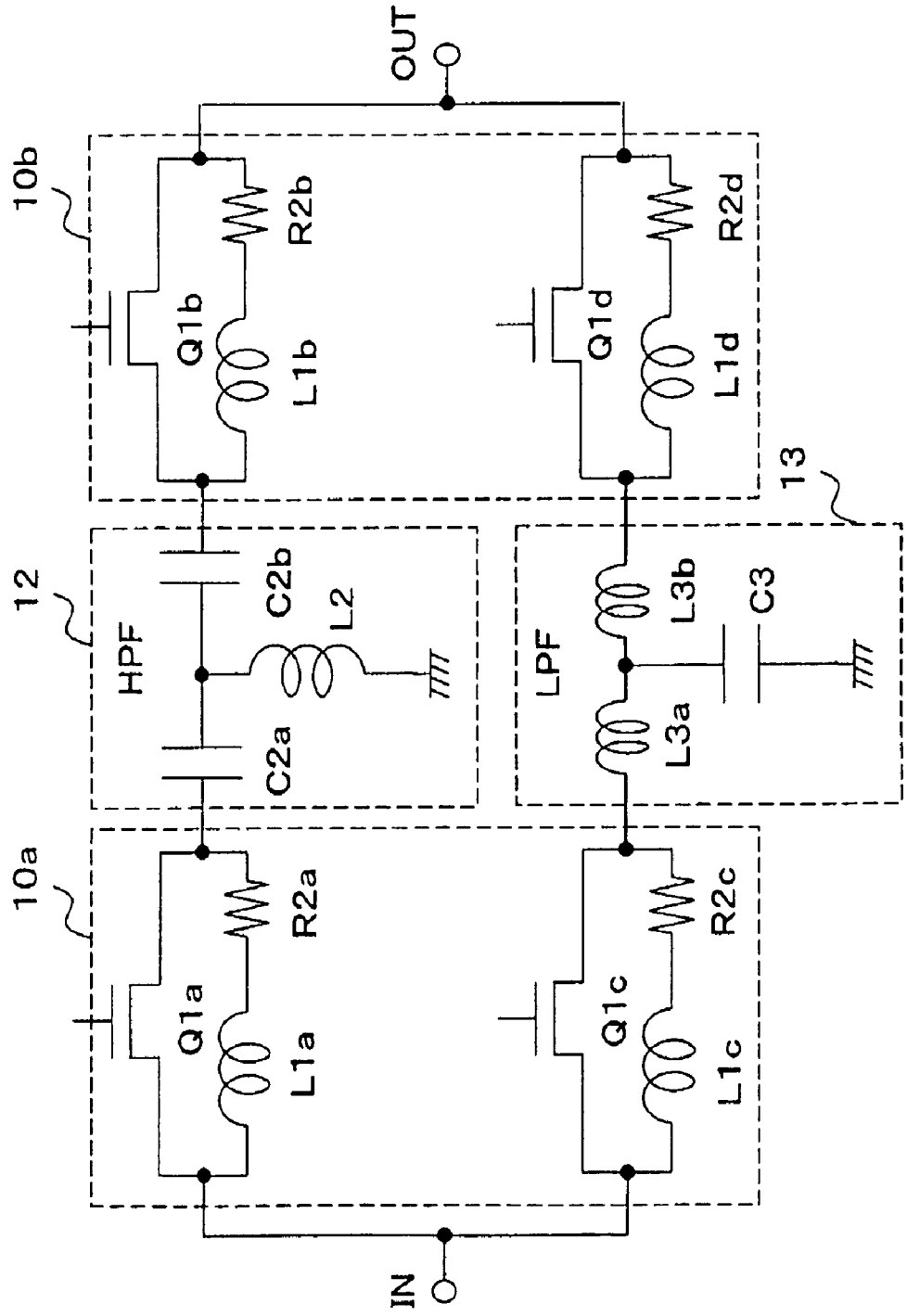
FIG. 1 is a circuit diagram showing the configuration of a phase shifter relating to an example of the present invention.
Figure 9:
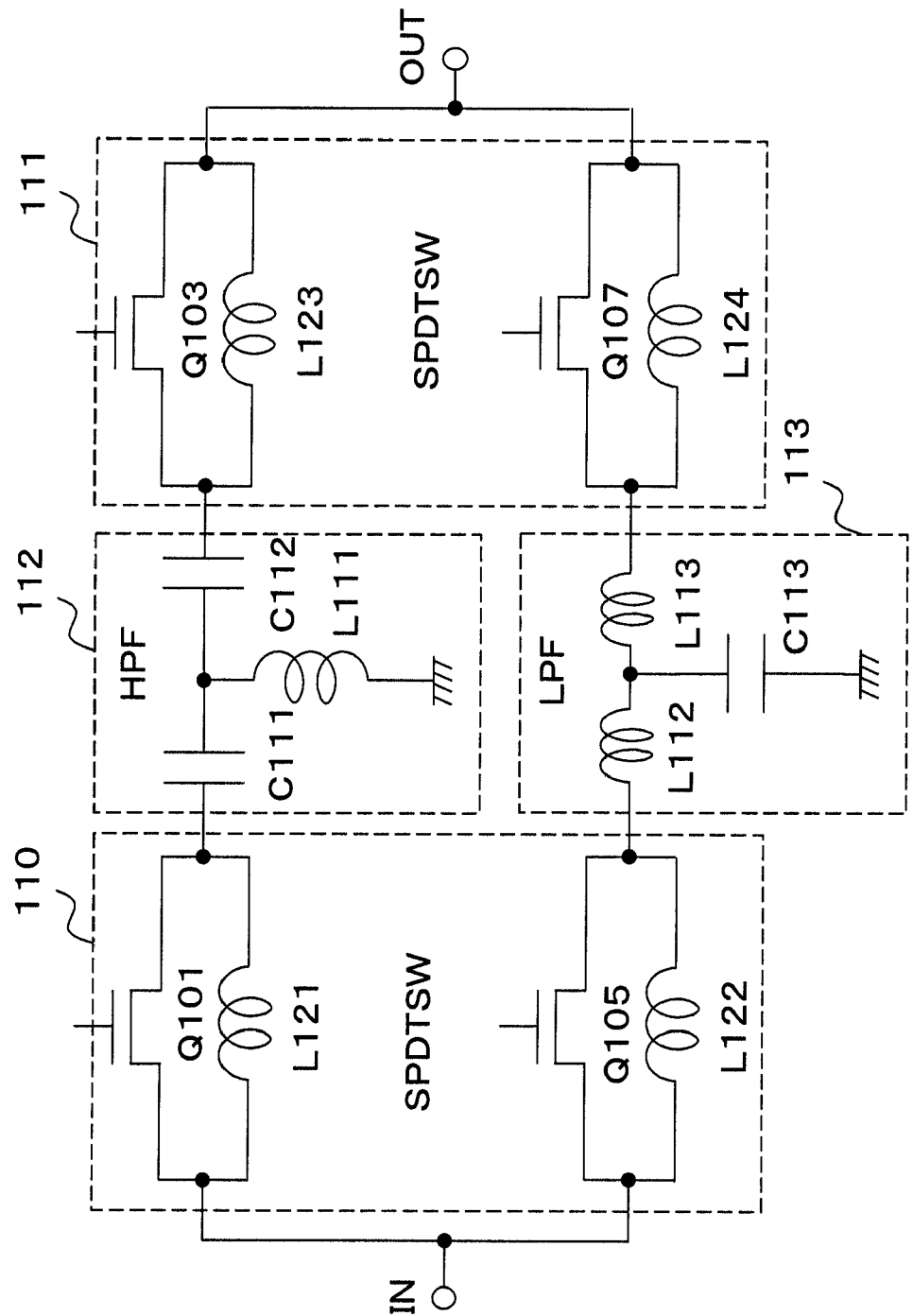
FIG. 9 is a circuit diagram showing the configuration of a conventional phase shifter.
Figure 10:
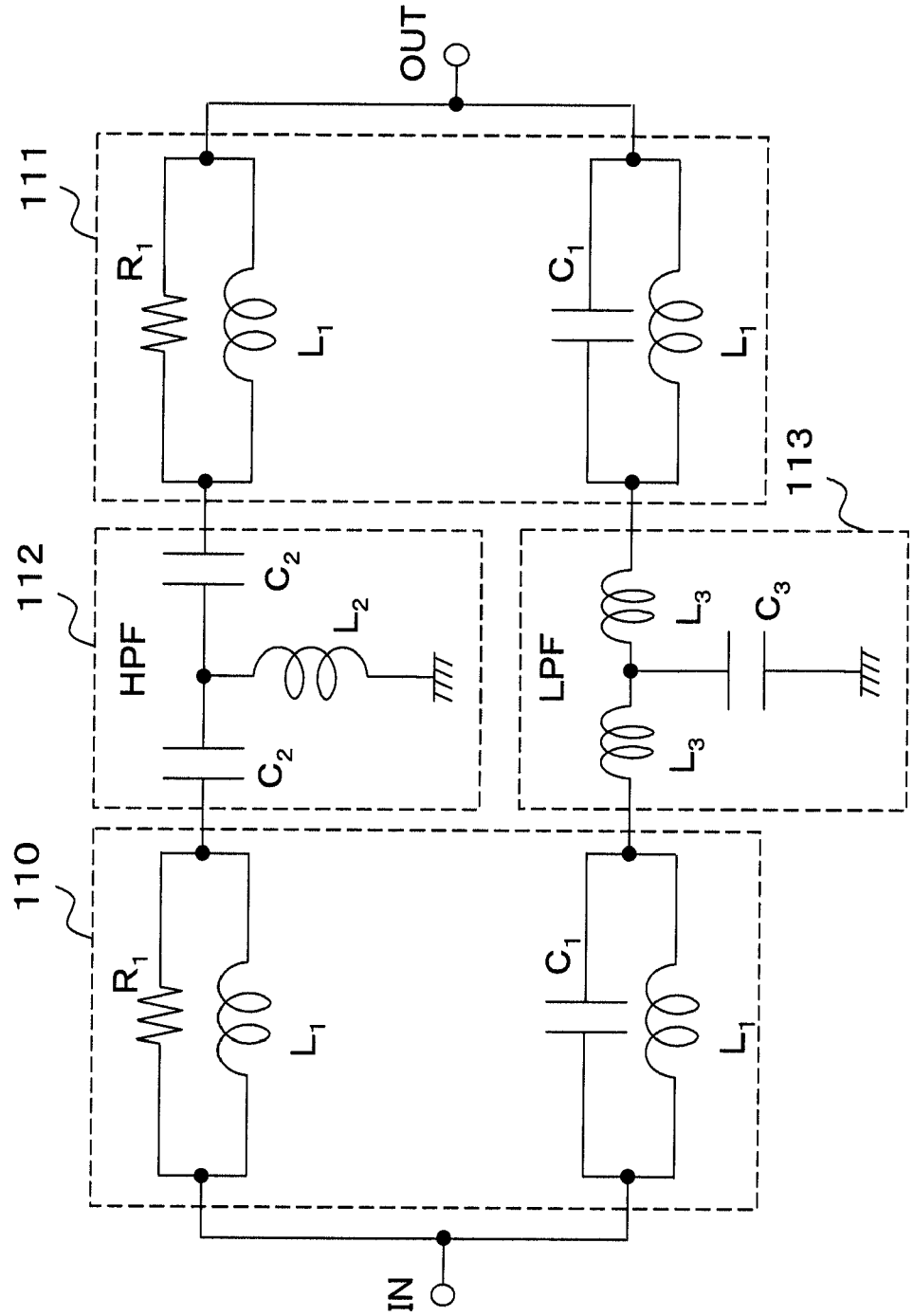
FIG. 10 is an equivalent circuit diagram of the conventional phase shifter.
Figure 11:
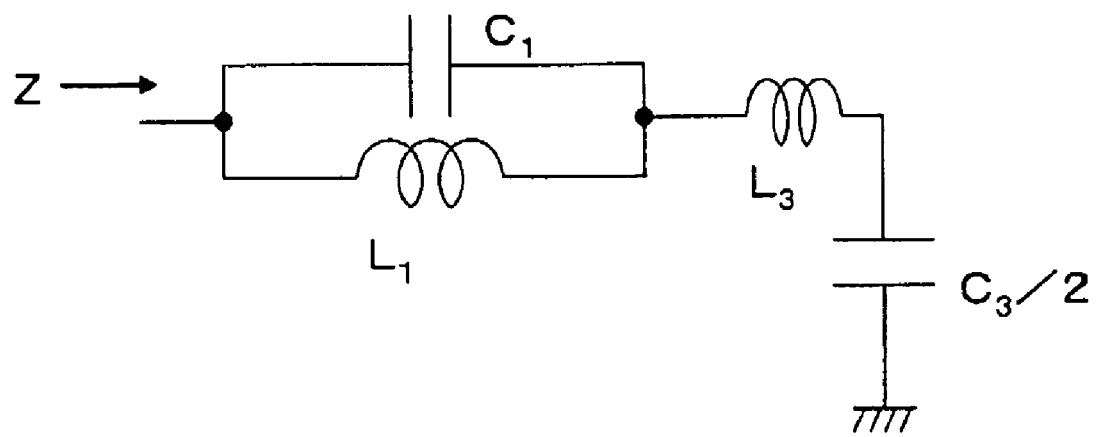
FIG. 11 is an equivalent circuit diagram of the impedance looking from the input or output side to the low-pass filter side.
Figure 12:
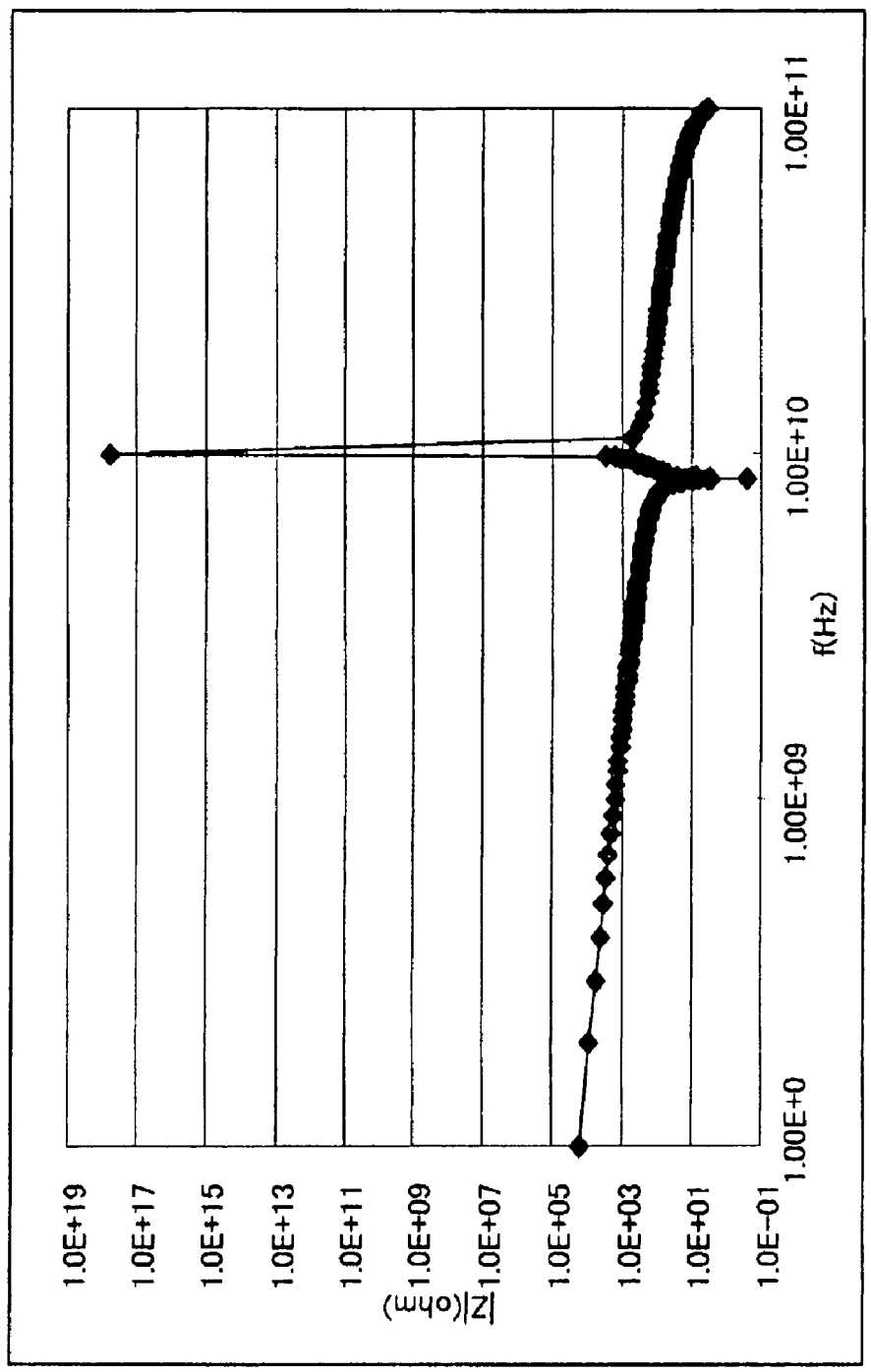
FIG. 12 is a drawing showing the frequency response of an impedance |Z|.

FIG. 1 is a circuit diagram showing the configuration of a phase shifter relating to an example of the present invention. In FIG. 1, the phase shifter comprises inductors L1a, L1b, L1c, L1d, L2, L3a, and L3b, capacitors C2a, C2b, and C3, FETs Q1a, Q1b, Q1c, and Q1d, resistors R2a, R2b, R2c, and R2d, an input terminal IN, and an output terminal OUT. The phase shifter shown in FIG. 1 is different from the one shown in FIG. 9 in that the resistors R2a, R2b, R2c, and R2d are connected in series with the inductors L1a, L1b, L1c, and L1d respectively, and they are further connected in parallel with each of the FETs, respectively. Otherwise, the configuration is identical. Therefore, the inductors connected in parallel with the switch devices will be described in detail, and the explanation of the other components will be omitted since they are identical to those in the conventional example. Here, the resistors R2a, R2b, R2c, and R2d represent resistance elements connected in series with each of the inductors or the parasitic resistance of any one of the inductors. Note that, in the case where resistance elements are inserted, the resistors represent resistance elements including the parasitic resistance of the inductors.

Figure 2:
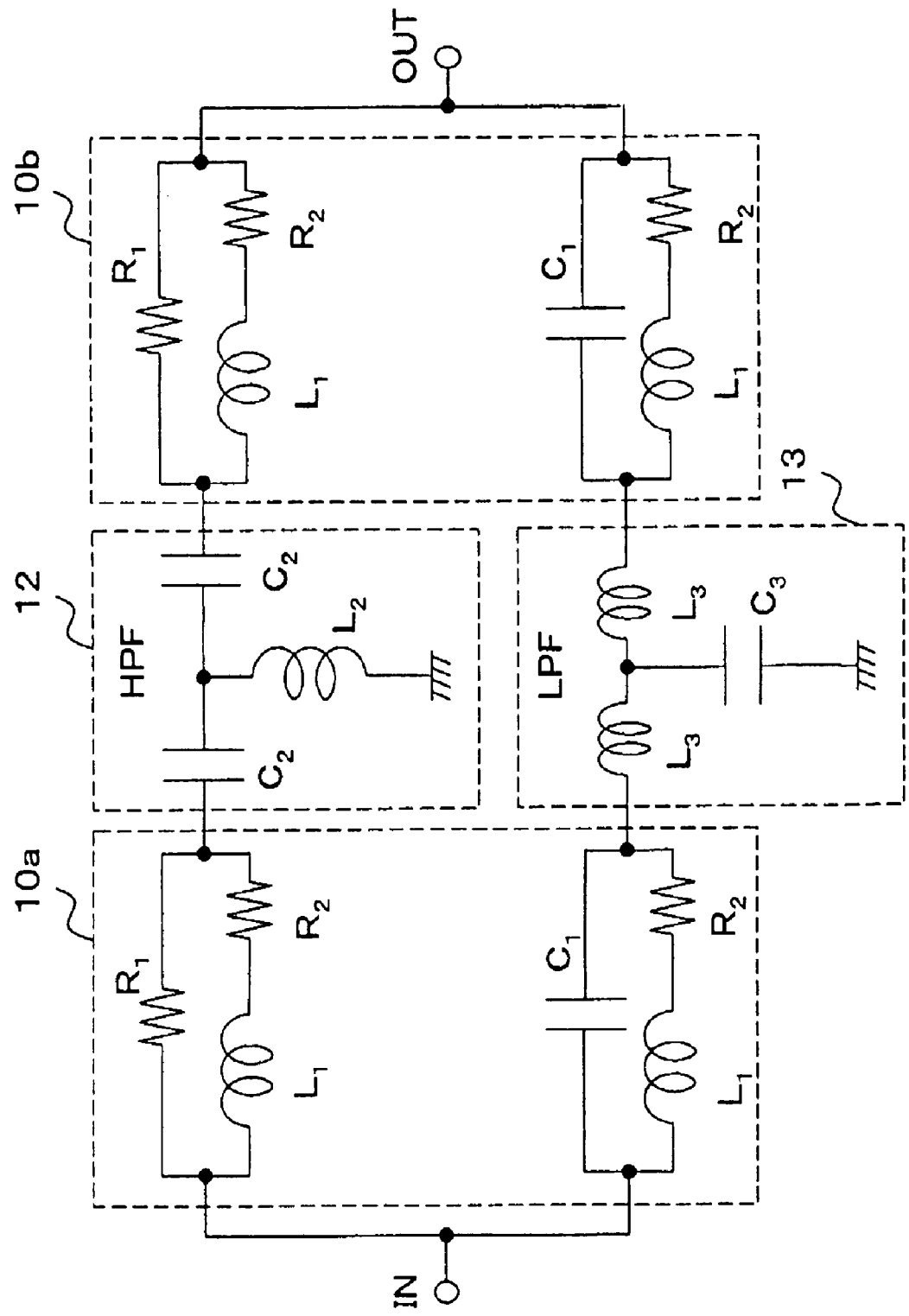
FIG. 2 is an equivalent circuit diagram of the phase shifter relating to the example of the present invention.

FIG. 2 is an equivalent circuit diagram when the FETs Q1a and Q1b are turned on and the FETs Q1c and Q1d are turned off in FIG. 1. In other words, an equivalent circuit diagram when the high-pass filter (HPF) 12 has pass characteristics is shown. A resistor R1 represents the on-state of the FETs and a capacitor C1 represents the off-state of the FETs. R2 represents the parasitic resistance of the inductors of the switch devices. Here, symbols attached to the components in FIG. 2 represent the component values. The circuit of FIG. 2 includes input terminal IN and output terminal OUT connected to a first single pole double throw switch device 10a and a second single pole double throw switch device 10b, which include inductance circuits including an inductance L1 and a resistance R2. High-pass filter (HPF) 12 includes capacitors C2 and inductor L2. Low-pass filter (LPF) 13 includes inductors L3 and capacitor C3.

Figure 3A:
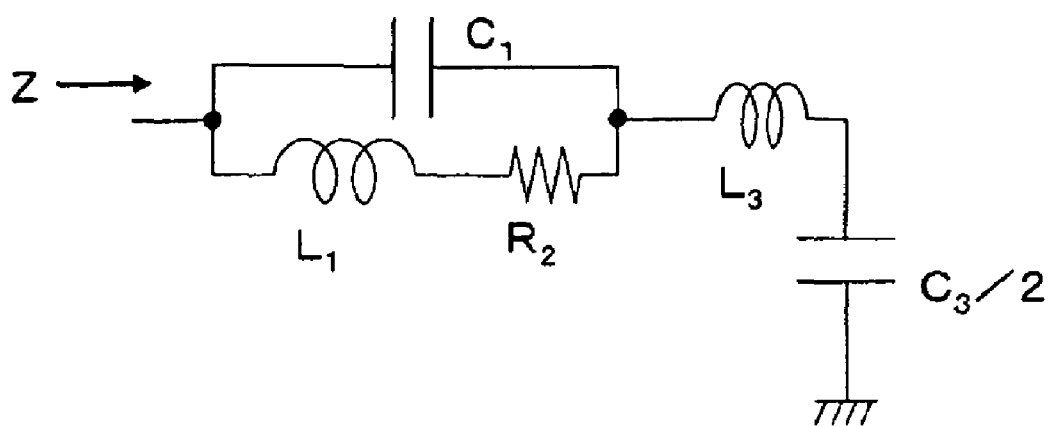
FIGS. 3A and 3B are equivalent circuit diagrams of the impedance looking from the input or output side to the low-pass filter side in the phase shifter relating to the example of the present invention.

Here, an impedance Z looking from the input or output side to the low-pass filter side is represented by an equivalent circuit diagram shown in FIG. 3A and by the following equation. Capacitance C3/2 represents the capacitance C3 divided by two. Note that the approximation is performed assuming that $R_2$ is small.

$$Z = j\left(\frac{\omega L_1}{1 - \omega^2 L_1 C_1} + \omega L_3 - \frac{2}{\omega C_3}\right)$$

Therefore, $$|Z| = \frac{\omega L_1}{1 - \omega^2 L_1 C_1} + \omega L_3 - \frac{2}{\omega C_3}$$

Figure 3B:
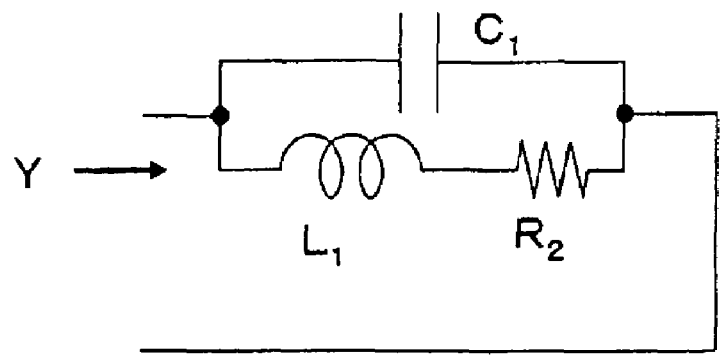

Further, an admittance Y of the parallel resonance circuit is represented by an equivalent circuit diagram shown in FIG. 3B and by the following equation.

$$Y = \frac{1}{R_2 + j\omega L_1} + j\omega C_1$$

$$= \frac{R_2}{R_2^2 + \omega^2 L_1^2} + j\omega\left(C_1 - \frac{L_1}{R_2^2 + \omega^2 L_1^2}\right)$$

Since the circuit resonates when the imaginary part of Y is 0 in this admittance Y, the resonance frequency $\omega_0$ is expressed as follows.

$$\omega_0 = \sqrt{\frac{1}{L_1 C_1} - \frac{R_2^2}{L_1^2}}$$

Here, the condition that makes $\omega_0$ ($f_0$) constant is $$C_1 = \frac{L_1}{R_2^2 + \omega_0^2 L_1^2}$$

Next, imagining a practical use, component values are given to the equivalent circuit shown in FIG. 2, and analysis regarding characteristics obtained by a simulation will be explained. Here, $R_1$=4 ohms; $R_2$=2 ohms, 10 ohms, or 20 ohms; $C_2$=0.7 pF; $C_3$=0.2 pf; $L_1$=1 nH; $L_2$=0.6 nH; $L_3$=0.15 nH. Further, the frequency band is from 8 GHz to 12 GHz, and the resonance frequency $f_0$ is 10 GHz. Further, as described, the equation of $C_1$ $$C_1 = \frac{L_1}{L_1^2 (2\pi f_0)^2 + R_2^2}$$

has been corrected so that $f_0$ is constant even if $R_2$ changes.

Figure 4:
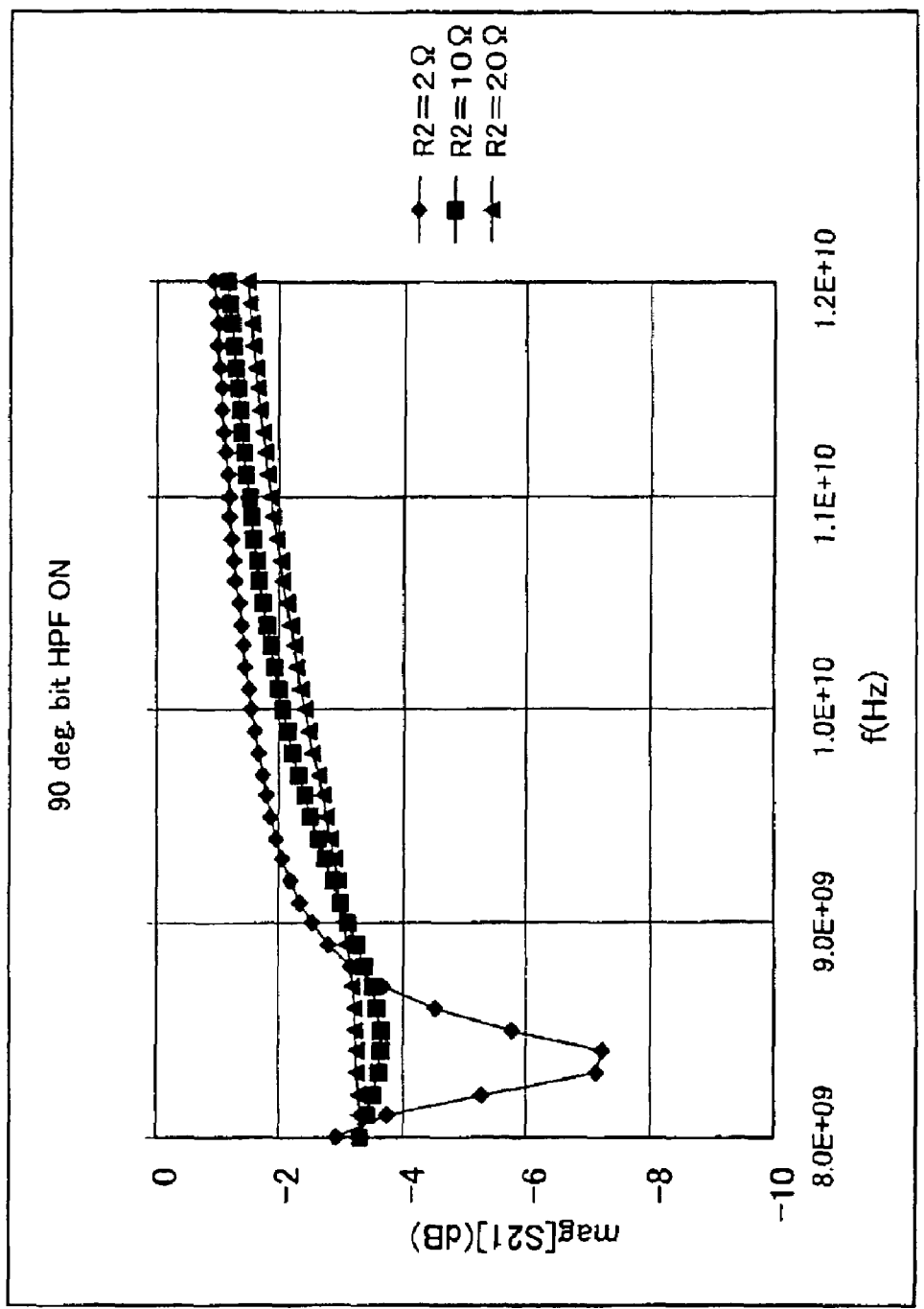
Figure 5:
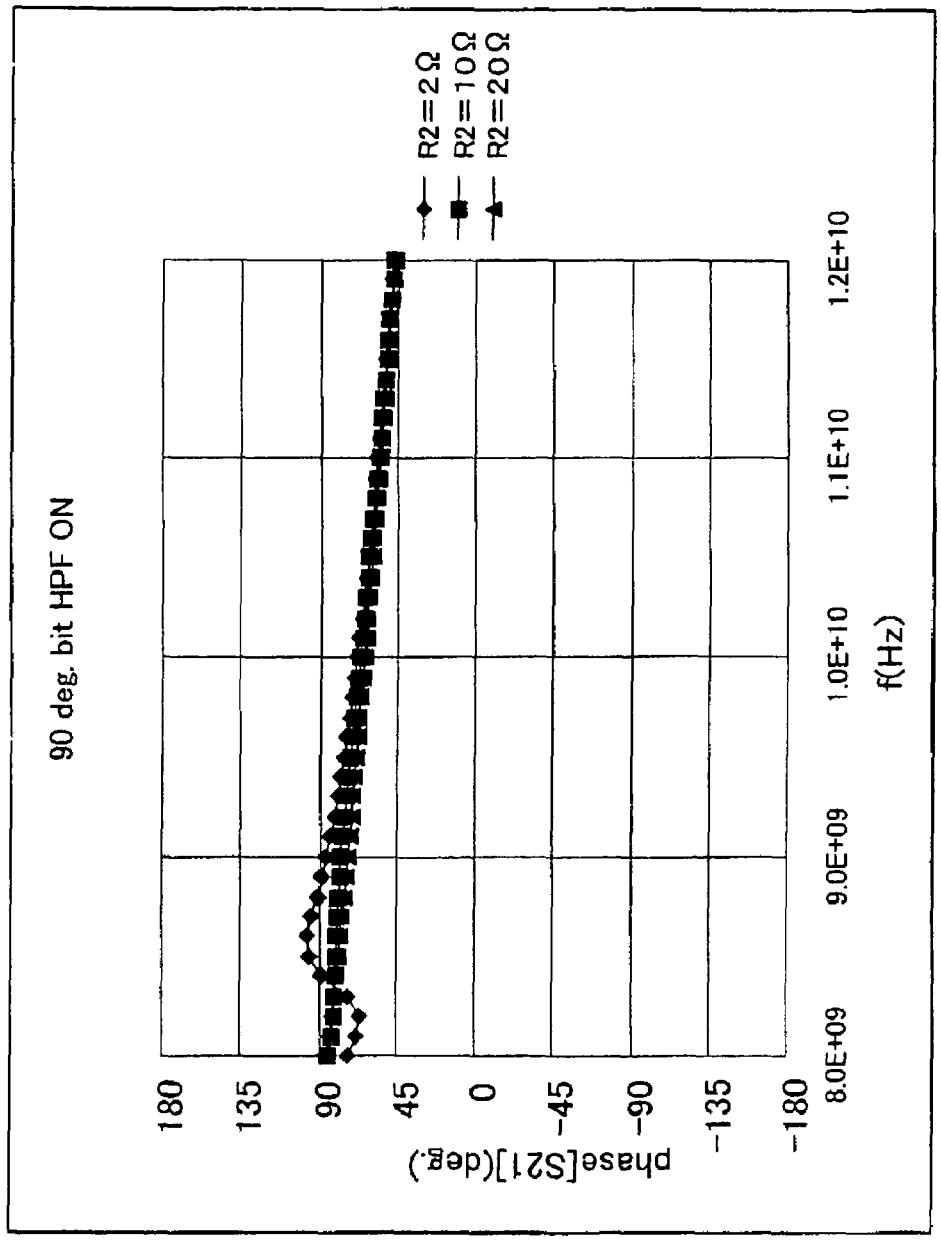
Figure 6:
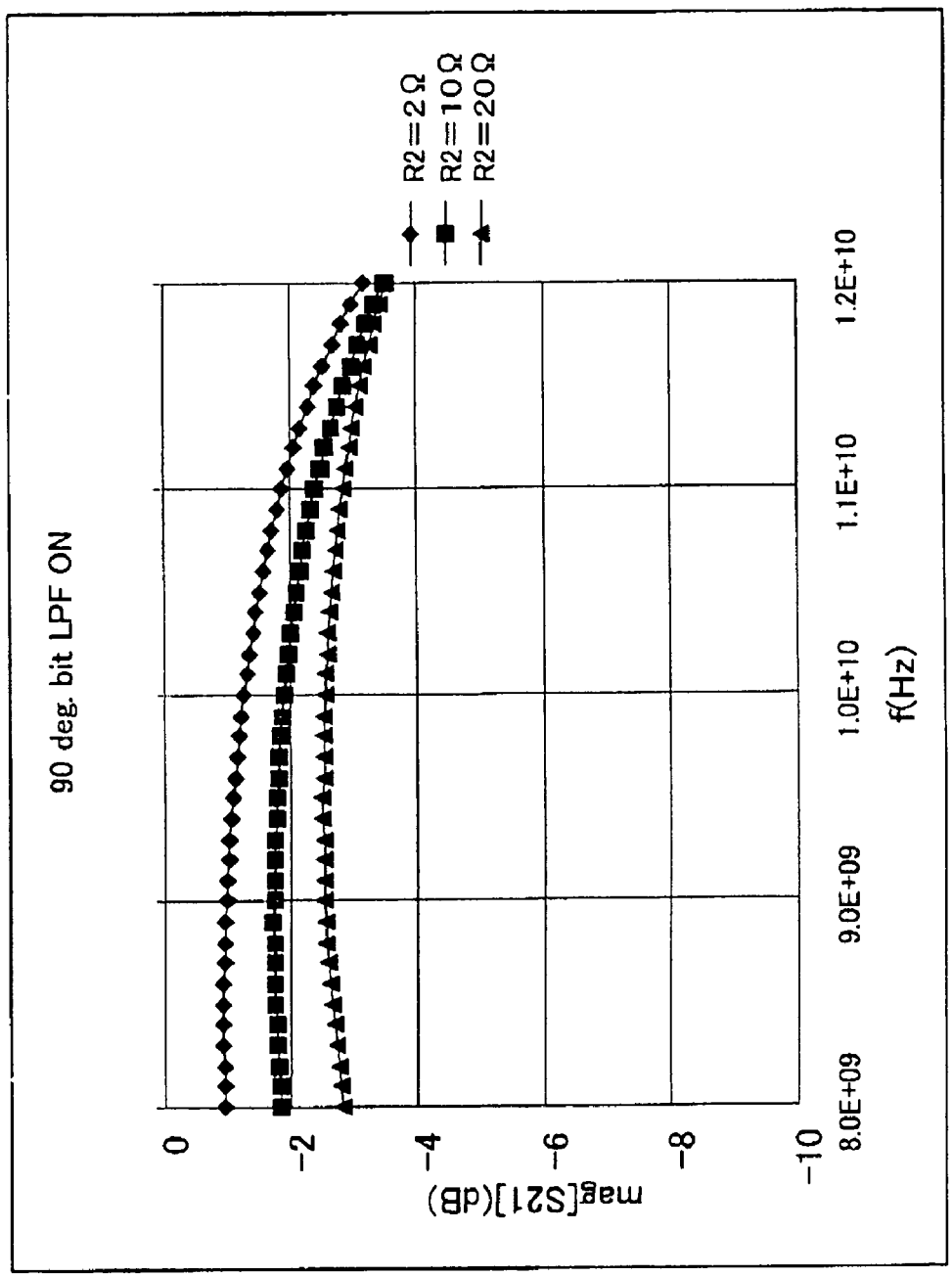
Figure 7:
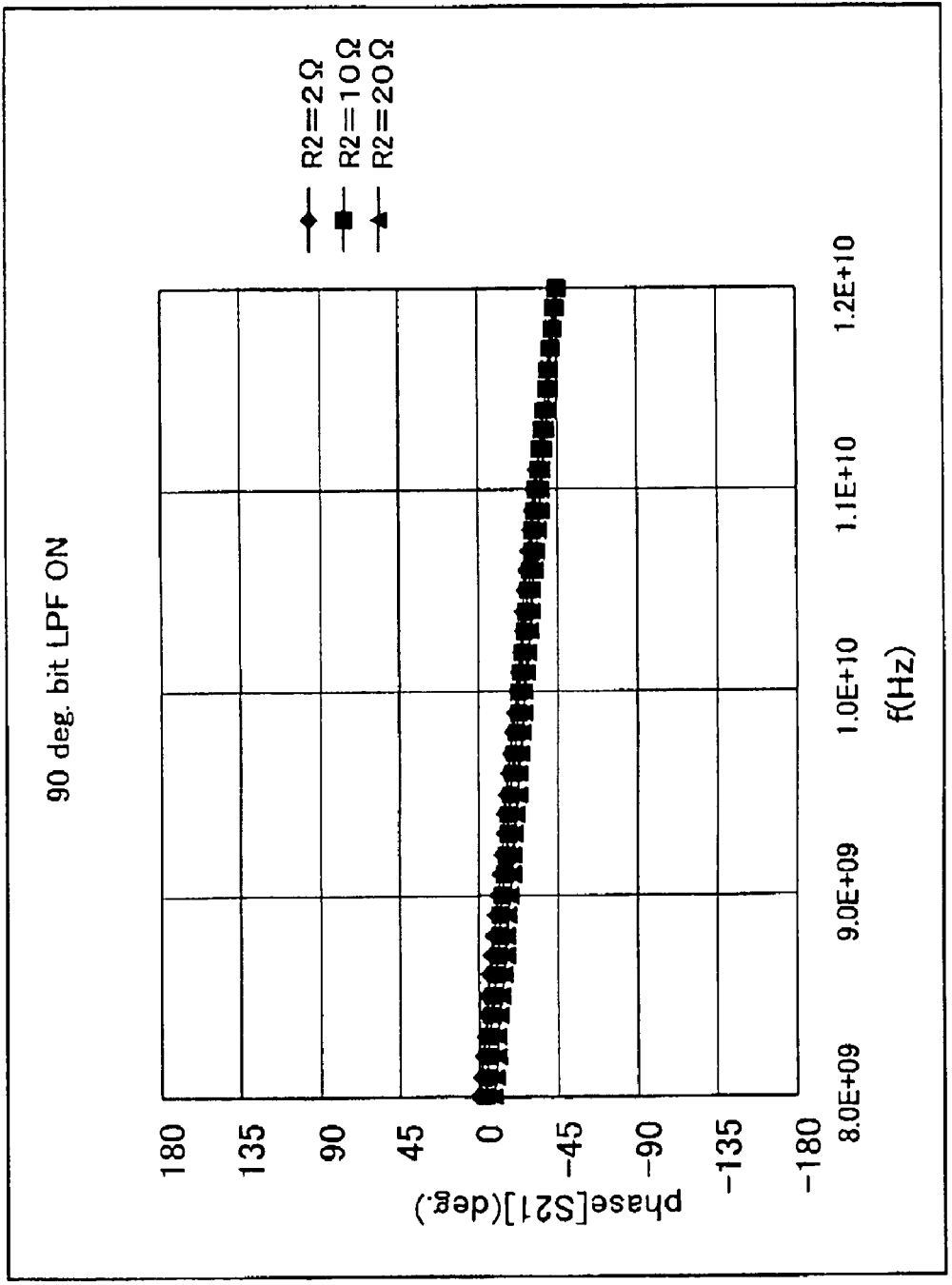
Figure 8:
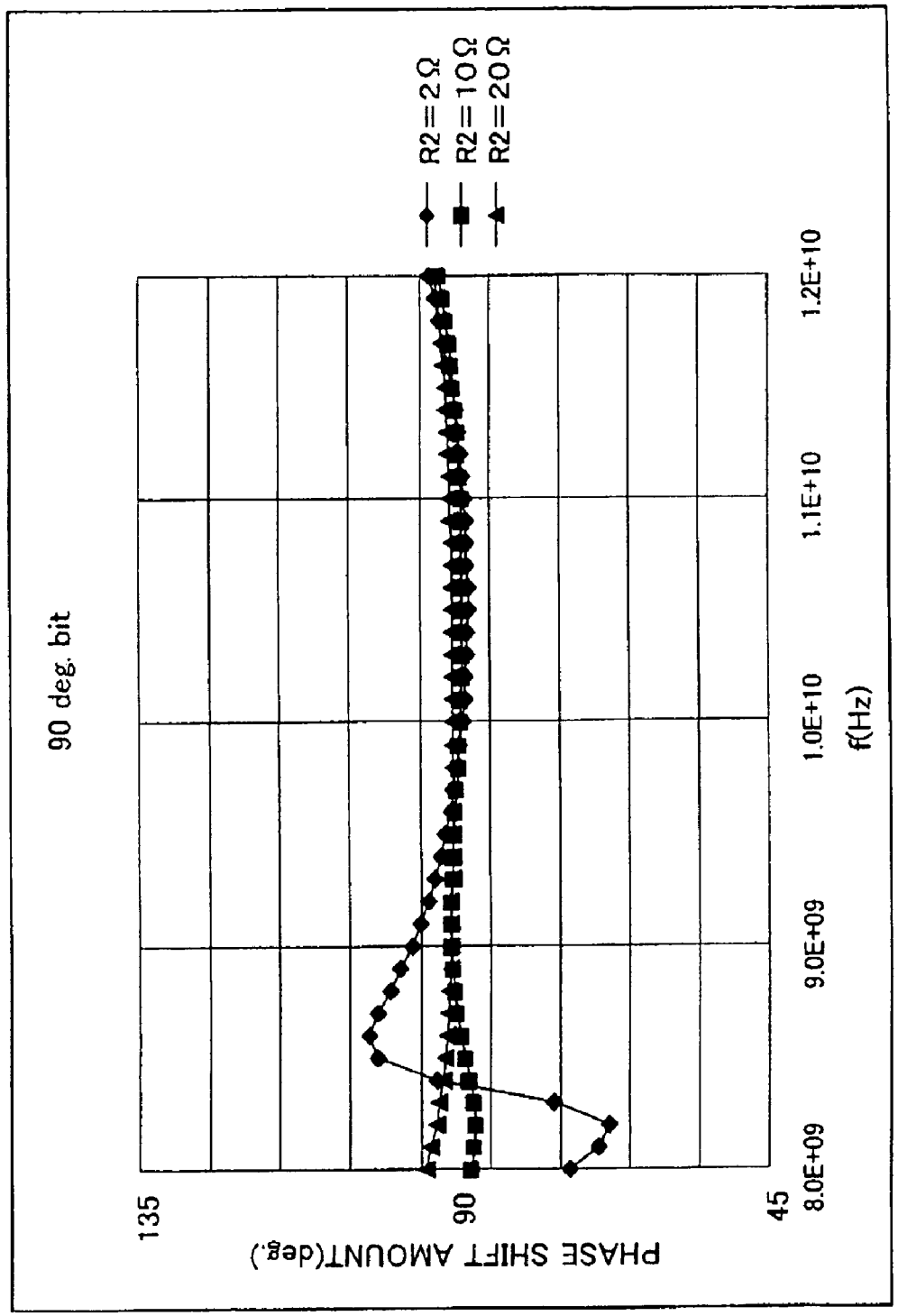

S parameter S21, which is the pass characteristics when the parasitic resistance R2 of the inductors of the switch devices in each of FIGS. 5-8 is 2 ohms, 10 ohms, and 20 ohms, is derived using a simulation. FIG. 4 is a graph titled 90 deg. bit HPF ON, showing the frequency response of S21 in magnitude vs. frequency when the high-pass filter side is turned on. FIG. 5 is a graph titled 90 deg. bit HPF ON, showing the frequency response of S21 in phase angle vs. frequency when the high-pass filter side is turned on. FIG. 6 is a graph titled 90 deg. bit LPF ON, showing the frequency response of S21 in magnitude vs. frequency when the low-pass filter side is turned on. FIG. 7 is a graph titled 90 deg. bit LPF ON, showing the frequency response of S21 in phase angle vs. frequency when the low-pass filter side is turned on. FIG. 8 is a graph titled 90 deg. bit, showing the frequency response of the phase vs. frequency difference obtained by subtracting the phase when the low-pass filter side is turned on from the phase when the high-pass filter side is turned on.

Referring to FIG. 4, when $R_2=2$ ohms, the magnitude of S21 decreases greatly around 8.4 GHz. Further, the phase response in FIG. 5 shows an increase caused by resonance around 8.4 GHz, and the phase-difference response in FIG. 8 also shows positive and negative peaks around 8.4 GHz. On the other hand, by raising the parasitic resistance $R_2$ of the inductor(s) to 10 ohms and 20 ohms, such peaks can be eliminated or reduced. Further, the mean square error of the phase shift amount in a frequency band between 8 GHz and 12 GHz is 7.15 degrees when $R_2=2$ ohms, however, it is improved to be 1.30 degrees when $R_2=10$ ohms and 1.27 degrees when $R_2=20$ ohms.

These positive and negative peaks in the characteristics caused by resonance occur when, with the high-pass filter side turned on, the impedance of the parts that should be in a high impedance state is reduced in the resonance circuit, on the low-pass filter side, constituted by three elements: the off-capacitance $C_1$ of the FET, the inductor $L_1$ of the switch device, and the capacitor $C_3$ of the low-pass filter. Therefore, by increasing the parasitic resistance $R_2$ of the inductor $L_1$, a high impedance can be maintained even at 8.4 GHz. As a result, the fluctuations (occurrence of peaks) in the characteristic curves caused by resonance can be suppressed.

On the other hand, when the low-pass filter side is turned on, the characteristics of S21 show smooth curves as shown in FIGS. 6 and 7, and turning off the high-pass filter side does not cause the decrease in impedance in the resonance circuit.

Next, a conductive material used for the inductors will be described. For a semiconductor device in a phase shifter for use in 1 GHz or higher, it is preferred that conductive materials having a higher resistivity than that of gold such as titanium nitride, tungsten silicide, platinum, and titanium be used for the inductors because larger resistance is needed.

In order to satisfy the conditions of the resistance in the inductance circuit as described, from the conditions for resonance to exist $$\omega_0 = \sqrt{\frac{1}{L_1 C_1} - \frac{R_2^2}{L_1^2}} \geq 0$$

$$R_2 = \rho \frac{l}{S} \leq \sqrt{\frac{L_1}{C_1}} = R\text{max}$$

($\rho$: resistivity, l: the length of the wiring

S: the sectional area of the wiring)

Therefore, from the following inequality, $$\rho \leq \frac{S}{l} \sqrt{\frac{L_1}{C_1}}$$

as an upper limit of the resistivity of the material used for the inductors, the following equation must be satisfied.

$$\rho = \frac{S}{l} \sqrt{\frac{L_1}{C_1}}$$

Now, imagining a practical use, for instance, when $L_1=1$ nH; $C_1=80$ fF; S=10 um (wiring width)×1 um (wiring thickness); and l=400 um, the upper limit of the resistivity has to be defined by $\rho=2.8\times10^{-4}\Omega\text{cm}$. Therefore, as the conductive material used for the inductors in the switch devices, conductive materials having a lower resistivity than this such as titanium nitride ($\rho=1.6\times10^{-4}\Omega\text{cm}$), tungsten silicide ($\rho=1.9\times10^{-4}\Omega\text{cm}$), platinum ($\rho=1.4\times10^{-5}\Omega\text{cm}$), and titanium ($\rho=7.0\times10^{-5}\Omega\text{cm}$) are preferred.

Note that the resistivity of gold is $\rho=3.0\times10^{-6}\Omega\text{cm}$, and R2 in the above equation will be 1.2 ohms. This means that, when the inductors are made up of gold, the resistance of the inductors is not sufficient to reduce the deterioration of the pass characteristics. Therefore, in the case where the inductors in the switch devices are made up of a low-resistivity material such as gold rather than a high-resistivity material, the decrease in impedance caused by resonance can be prevented by connecting a resistance element to the inductor in series thereby increasing the resistance.

The above explanation mainly refers to the switch on the input terminal side, however, the same applies to the switch on the output terminal side since the phase shifter is configured symmetrically with respect to the filters (HPF and LPF).

Further, the short-circuit caused by resonance does not occur in the inductance circuit connected in parallel with the switch connected to the high-pass filter side, and there is no deterioration of the characteristics such as the one shown in FIGS. 6 and 7. Therefore, it is not necessary to define a lower limit of the resistance in the inductance circuit, however, from the design standpoint, it is conventional to configure the switch device on the high-pass filter side identically to the one on the low-pass filter side.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A phase shifter comprising:
   a low-pass filter;
   a high-pass filter;
   first and second single pole double throw switches provided on input and output sides of the low-pass filter and the high-pass filter respectively and operatively linked to each other, wherein the first and second single pole double throw switches each comprising:
   a first switch device that connects a single pole side junction node and said low-pass filter;
   a first inductance circuit connected in parallel with said first switch device;
   a second switch device that connects said single pole side junction node and said high-pass filter and that performs an ON/OFF operation exclusively from said first switch device; and
   a second inductance circuit connected in parallel with said second switch device;

each said first inductance circuit being constituted by a serially-connected circuit of an inductor and a resistor, wherein the inductance of the inductor and the resistance of the resistor of each of the first inductance circuit and the capacitance of each said first switch device in an off state are selected so as to suppress fluctuation in the pass characteristics of the phase shifter.

2. The phase shifter as defined in claim 1, wherein each said first switch device is connected to a single pole side junction node and said low-pass filter on an input side and output side, respectively;

each said first inductance circuit is connected in parallel with each said first switch device on the input side and output side, respectively;

each said second switch device is connected to said single pole side junction node and said high-pass filter on the input side and output side, respectively; and each said second inductance circuit is connected in parallel with each said second switch device on the input side and output side, respectively.

3. The phase shifter as defined in claim 1, wherein, when the inductance of each said inductor is L, the resistance of each said resistor is R, and the capacitance of each said first switch device in an off state is C in each said first inductance circuit, R is larger than 0 and smaller than $(L/C)^{1/2}$.

4. The phase shifter as defined in claim 1, wherein each said resistor is a parasitic resistance of each said inductor.

5. The phase shifter as defined in claim 1, wherein each said inductor and each said resistor are made up of a material having an electrical resistivity higher than that of gold.

6. The phase shifter as defined in claim 1, wherein each said inductor is made up of a material having an electrical resistivity equal to or lower than that of gold.

7. The phase shifter as defined in claim 1, wherein each of said first and second switch devices are constituted by respective field-effect transistors.

8. A phase shifter comprising:

a low-pass filter and a high-pass filter; first single pole double throw switches and second single pole double throw switches provided on input side and output side respectively of said low-pass filter and said high-pass filter, respectively; said first and second single pole double throw switches selectively switching between said low-pass filter and said high-pass filter; wherein said first and second single pole double throw switches disposed on the input side and output side include:

a first switch device that connects a single pole side junction node and said low-pass filter each on the input side and output side, respectively;

a first inductance circuit connected in parallel with said first switch device each on the input side and output side, respectively;

a second switch device that connects said single pole side junction node, each on the input side and output side, respectively, and said high-pass filter, said second switch device performs an ON/OFF operation exclusively from said first switch device; and a second inductance circuit connected in parallel with said second switch device each on the input side and output side, respectively;

said first inductance circuit each being constituted by a serially-connected circuit of an inductor and a resistor, wherein the inductance of the inductor and the resistance of the resistor of the first inductance circuit and the capacitance of the first switch device in an off state are selected so as to suppress fluctuation in the pass characteristics of the phase shifter.

9. The phase shifter as defined in claim 8, wherein said first and second switch devices are constituted by respective field-effect transistors.

10. The phase shifter as defined in claim 8, wherein said inductor is made up of a material having an electrical resistivity equal to or lower than that of gold.

11. The phase shifter as defined in claim 8, wherein, when the inductance of said inductor is L, the resistance of said resistor is R, and the capacitance of said first switch device in an off state is C in said first inductance circuit, R is larger than 0 and smaller than $(L/C)^{1/2}$.

12. The phase shifter as defined in claim 8, wherein said resistor is a parasitic resistance of said inductor.

13. The phase shifter as defined in claim 8, wherein said inductor and said resistor are made up of a material having an electrical resistivity higher than that of gold.

* * * * *

UNITED STATES PATENT AND TRADEMARK OFFICE
CERTIFICATE OF CORRECTION

PATENT NO. : 7,719,386 B2
APPLICATION NO. : 11/923092
DATED : May 18, 2010
INVENTOR(S) : Takao Atsumo, Hiroshi Mizutani and Tatsuya Miya It is certified that error appears in the above-identified patent and that said Letters Patent is hereby corrected as shown below:

Column 6, Line 30, delete "a)o" and insert -- $\omega_0$ --

Signed and Sealed this

Fourteenth Day of September, 2010

David J. Kappos
*Director of the United States Patent and Trademark Office*